United States Patent
Sekikawa et al.

(10) Patent No.: US 6,489,661 B2
(45) Date of Patent: Dec. 3, 2002

(54) METHOD OF MANUFACTURING SEMICONDUCTOR DEVICE AND SEMICONDUCTOR DEVICE

(75) Inventors: Nobuyuki Sekikawa, Niigata (JP); Wataru Andoh, Niigata (JP); Masaaki Anezaki, Gunma (JP); Masaaki Momen, Niigata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/783,794

(22) Filed: Feb. 15, 2001

(65) Prior Publication Data
US 2001/0029093 A1 Oct. 11, 2001

Related U.S. Application Data

(62) Division of application No. 09/362,125, filed on Jul. 27, 1999, now Pat. No. 6,211,046.

(51) Int. Cl.$^7$ ................................................ H01L 29/00
(52) U.S. Cl. ........................ 257/509; 257/412; 257/413; 257/638; 257/647
(58) Field of Search ............................... 257/509, 638, 257/647, 413, 412

(56) References Cited

U.S. PATENT DOCUMENTS

| | | | |
|---|---|---|---|
| 4,766,088 A | * 8/1988 | Kono et al. | ................. 437/52 |
| 5,441,904 A | * 8/1995 | Kim et al. | .................... 437/40 |
| 5,840,618 A | * 11/1998 | Kondo | ........................ 438/533 |
| 5,851,872 A | * 12/1998 | Chen et al. | ................. 438/253 |
| 5,885,877 A | * 3/1999 | Gardner et al. | ............. 438/300 |

FOREIGN PATENT DOCUMENTS

JP 09045796 A * 2/1997

* cited by examiner

Primary Examiner—Nathan J. Flynn
Assistant Examiner—Remmon R. Fordé
(74) Attorney, Agent, or Firm—Fish & Richardson P.C.

(57) ABSTRACT

When an element isolation film is formed by the LOCOS technique, as an underlying buffer layer of an oxidation resisting film, a pad oxidation film and pad poly-Si film are used. When an element is formed, they are used as a gate oxide film and a part of a gate electrode to relax a level difference between the gate electrode and the wiring on the element isolation film. A first poly-Si film (pad poly-Si film) is etched to leave its certain thickness to relax the level difference more greatly. In such a process, in manufacturing a semiconductor integrated circuit using the LOCOS technique, the number of manufacturing steps can be reduced and the level difference between the gate electrode on the gate insulating film and the wiring on the element isolation film can be relaxed.

13 Claims, 3 Drawing Sheets

METHOD OF MANUFACTURING SEMICONDUCTOR DEVICE AND SEMICONDUCTOR DEVICE

This is a divisional of application Ser. No. 09/362,125 filed Jul. 27, 1999, Pat. No. 6,211,046 B1, which in turn claims the benefit of Japanese Patent Application No. Hei 10-216201 filed Jul. 30, 1998.

BACKGROUND OF THE INVENTION

1. Field of the Invention

The present invention relates to a method of manufacturing a semiconductor device and the semiconductor device, and more particularly to a method for manufacturing a semiconductor device having an element isolation film formed by the LOCOS (Local Oxidation of Silicon) technique.

2. Description of the Related Art

In the field of the method for manufacturing a semiconductor device, the "PBL" (Poly-Buffered LOCOS) technique is known as a method used for forming an element isolation film through the LOCOS technique. The element isolation film isolates various semiconductor devices such as MOS transistors. The PBL technique is to form a polycrystalline silicon (hereinafter referred to as "poly-Si") film previously, which serves as a buffer layer between an oxidation-resisting film and a semiconductor substrate. Specifically, this technique comprises the steps of previously forming an insulating film (pad oxide film) on the entire surface of a substrate, forming a poly-Si film constituting a pad poly-Si film (hereinafter referred to as "pad poly-Si film") thereon, and forming an oxidation resisting film thereon and performing thermal oxidation.

Now referring to the drawings, an explanation will be given of a method of manufacturing a semiconductor device using the PBL technique.

STEP 1:

As seen from FIG. 3A, a pad oxide film 52 is formed on a semiconductor substrate 51 using the thermal oxidation technique. A pad poly-Si film 53 is formed on the pad oxide film 52 on the CVD (Chemical Vapor Deposition) technique. A silicon nitride film 54 serving as an oxidation resisting film is formed using the CVD technique to form an opening in the region where an element isolation film is to be formed.

STEP 2:

As seen from FIG. 3B, the semiconductor substrate 51 is thermally oxidized using the silicon nitride film 54 as a mask to form an element isolation film 55. At this time, the pad oxide film 52 prevents crystal defects on the surface of the semiconductor substrate beneath a bird's beak from occurring. The bird's beak may be generated in such a way that the oxide region of the semiconductor substrate 51 constituting the element isolation film 55 extends more externally than the edge of the opening of the mask and its tip intrudes leanly in between the silicon nitride film 54 and semiconductor substrate 51. The pad poly-Si film 53 suppresses the bird's beak from extending.

STEP 3:

As seen from FIG. 3C, the pad oxide film 52, pad poly-Si film 53 and silicon nitride film 54 which are located on the region where an element is formed, are removed.

STEP 4:

As seen from FIG. 3D, using the thermal oxidation technique, a gate insulating film 56 is formed, and using the CVD technique, a poly-Si film 57 and a tungsten silicide film 58 are formed.

STEP 5:

As seen from FIG. 3E, using the photolithography, the poly-Si film 57 and tungsten silicide film 58 are patterned to form a gate electrode 59 and wiring 60. Thereafter, using the gate electrode 59 as a mask, impurity ions are injected into the surface of the semiconductor substrate 51 using the ion implantation technique to form a source/drain region (not shown) Further, an interlayer insulating film and wiring are made, thereby completing a semiconductor integrated circuit.

As described above, when the element isolation film is formed using the LOCOS technique, the pad oxide film 52 and pad poly-Si film 53, which are left beneath the silicon nitride film 54 serving as an oxidation resisting film, serve as a buffer layer for suppressing the growth of the bird's beak. However, they are once removed in the manufacturing process and thereafter the gate insulating film 56 and the poly-Si film 57 constituting the gate electrode are stacked. This increases the number of the manufacturing steps. Further, the element isolation region 55 is formed to swell from the surface of the semiconductor substrate 1 so that a large level difference is produced between the gate electrode 58 formed on the gate insulating film 56 and the wiring 60 formed on the element isolation film 55. Therefore, in the lithography process in the subsequent wiring forming step, the accuracy of adjusting a focal point for exposure is attenuated and hence sufficient pattern accuracy cannot be attained.

SUMMARY OF THE INVENTION

The present invention has been accomplished in view of the above circumstance.

An object of the present invention is to reduce the number of steps in a process for manufacturing a semiconductor integrated circuit.

An object of the present invention is to reduce the level difference between a gate electrode on a gate insulating film and a wiring on an element isolation region.

In order to attain the above object, in accordance with the present invention, the pad oxide film and pad poly-Si film are not removed, but used as a part of the gate oxide film and gate electrode, thereby relaxing the above level difference.

Specifically, in accordance with a first aspect of the present invention, there is provided a method of manufacturing a semiconductor device comprising the steps of: forming a gate insulating film on a semiconductor substrate; forming a first silicon film on the gate insulating film; forming a pattern of an oxidation resisting film on the first silicon film; thermally oxidizing the first silicon film and semiconductor substrate using the pattern of the oxidation resisting film to form an element isolation film; removing the pattern of the oxidation resisting film so that an element area surface surrounded by the element isolation film is exposed; patterning the second and first silicon films so that a wiring of the second silicon film is formed on the element isolation film and a gate electrode composed of the first and second silicon films is formed on the element area surface. In such a method, an oxide film and first silicon film, which are used as the pad insulating film and pad electrode and also used as the buffer layer in LOCOS, are used as the gate insulating film and a part of the gate electrode, respectively. Thus, the level difference between the wiring on the element isolation film and the gate electrode is attenuated to flatten the surface. The gate insulating film and gate electrode are used as they are so that the surface of the element region can be maintained clean without contamination. Thus, the gate insulating film having a high withstand voltage can be obtained, thus attenuating occurrence of poor withstand voltage.

Preferably, the method of manufacturing a semiconductor device further comprises the steps: after the step of forming the second silicon film, forming a metal silicide film on the second silicon film. The step of patterning the second and first silicon films comprises the step of: further patterning the metal silicide film so that a wiring of the second silicon film and the metal silicide film is formed on the element isolation film and the gate electrode composed of-the first and second silicon films and metal silicide film is formed on the element area surface.

In this configuration, the resistance of the wiring and electrode can be reduced.

Preferably, the method of manufacturing a semiconductor device according to the first aspect, further comprises the step: prior to the step of forming the element isolation film, etching a part of a surface of the first silicon film using the oxidation resisting film as at least a part of a mask so that a prescribed thickness of the first silicon film is left.

In this configuration in which the first silicon film is etched to leave a prescribed thickness, the level difference can be further relaxed.

Preferably, in the method of manufacturing a semiconductor device according to the first aspect, the first and second silicon films are made of poly-Si.

Preferably, in the method of manufacturing a semiconductor device according to the first aspect, the first silicon film is a poly-Si film which is more heavily doped than the second silicon film.

In this configuration, the second silicon film, which is changed into silicide, is not required to be highly doped. In addition, since the second silicon film located on the element isolation film is not highly doped, an inconvenience is avoided that impurities are diffused into the surface of the element isolation film to become a film saving slight conductivity such as a PSG film, whereas the wiring, in which the impurity concentration is reduced, becomes to have high resistance.

Preferably, in the method of manufacturing a semiconductor device according to the first aspect, the oxidation resisting film is a silicon nitride film.

In accordance with the second aspect of the preset invention, there is provided a semiconductor device comprising: a semiconductor substrate; an element isolation film formed by the LOCOS technique on a surface of the semiconductor substrate; an element region surrounded by the element isolation film; source/drain regions formed within the element region on the surface of the semiconductor substrate, and a gate insulating film and a gate electrode formed on a channel region between the source/drain regions; and a wiring formed on the element isolation film, wherein the gate electrode is composed of a first silicon film and a second silicon film formed on the first silicon film and the wiring is made of the second silicon film.

Preferably, in the semiconductor device according to the second aspect, a surface of the second silicon film is covered with a metal silicide film.

In accordance with the method of manufacturing a semiconductor device according to the present invention, prior to the LOCOS oxidation for element isolation, the region where an element is to be formed is covered with an insulating film and a pad poly-Si film for forming an electrode pad, and the oxidation resisting film is formed on the resultant surface and heat-treated to form the element isolation film. The pad poly-Si film, without being removed, is used as the first poly-Si film for a part of the gate electrode, and the insulating film (pad oxidation film) is used as the gate insulating film. Therefore, the steps for removing these respective films and forming them again are not required, thus shortening the manufacturing process, reducing the manufacturing cost and manufacturing the manufacturing period.

The gate electrode below the element isolation film includes the first poly-Si film whereas the wiring on the element isolation film does not include the first poly-Si film. The wiring is thinner than the gate electrode so that the level difference between the surfaces of the element isolation film and the element area, thus flattening the surface. Thus, the accuracy of exposure adjustment is improved in the step of using lithography and the overlaid wiring can be easily formed.

Only the first poly-Si film can be highly doped, and the second poly-Si film can be lightly doped. In this structure, the tungsten silicide film with low resistance can be formed on the element isolation film of $SiO_2$. When the poly-Si is highly doped with phosphorus, the element isolation film is prevented from being changed into PSG so that its insulation degree is reduced.

The above and other objects and features of the present invention will be more apparent from the following description taken in conjunction with the accompanying drawings.

DESCRIPTION OF THE PREFERRED EMBODIMENTS

Embodiment 1

An explanation will be given of a first embodiment of the present invention.

Figure 1A:
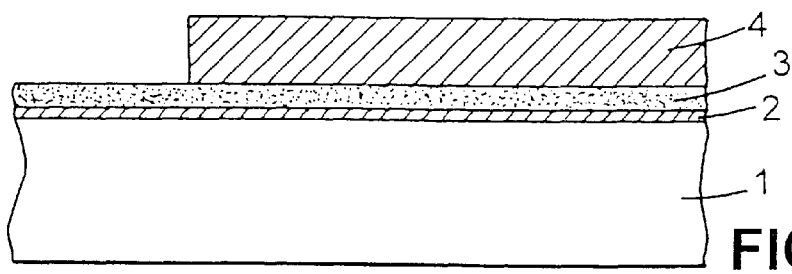
FIG. 1 is a sectional view for explaining a manufacturing method according to a first embodiment of the present invention.

STEP 1:

As seen from FIG. 1A, using the thermal oxidation technique, a gate insulating film 2 having a thickness of 50 A–200 A is formed on the surface of a semiconductor substrate 1. Using the CVD technique, a first poly-Si film 3 (first silicon film) having a thickness of 500 A–1000 A is formed on the entire surface. Further, using the CVD technique, a silicon nitride film 4 having a thickness of 500–1000 A is formed which serve as an oxidation resisting film. Using the photolithography, an opening is formed in a prescribed region where an element isolation film is to be formed.

Figure 1B:
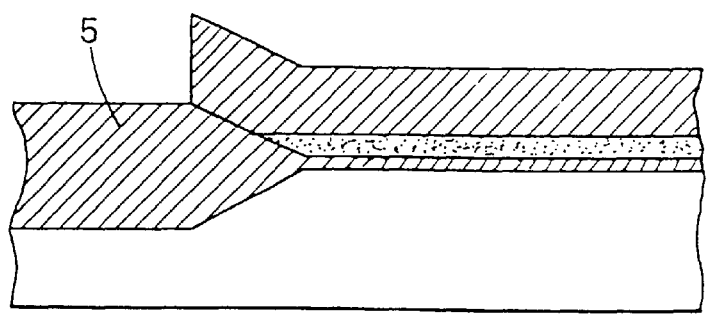

STEP 2:

As seen from FIG. 1B, using the silicon nitride film 4 as a mask, the semiconductor substrate 1 is thermally oxidized to form an element isolation film 5 of silicon oxide. At this time, the element isolation film 5 has a thickness of about 3500 A and is formed to swell on the semiconductor substrate 1, and the upper surface of the element isolation film 5 swells from the upper surface of the semiconductor substrate 1 by about 2000 A.

Figure 1C:
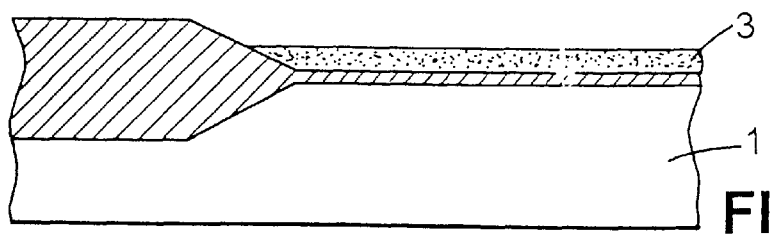

STEP 3:

As shown in FIG. 1C, the silicon nitride film 4 is removed.

Figure 1D:
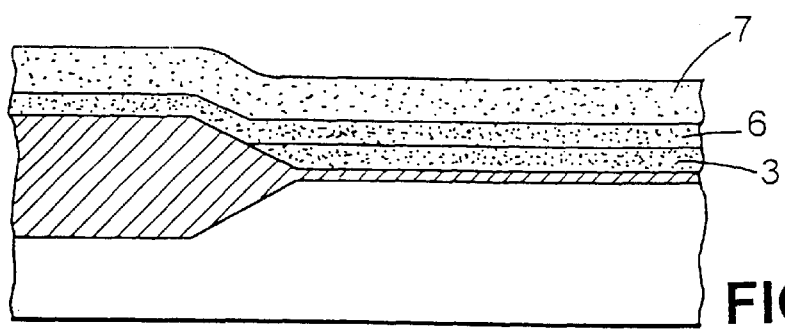

STEP 4:

As shown in FIG. 1D, using the CVD technique, a second poly-Si film 6 (second poly-Si film) having a thickness of 500 A–1000 A is formed. Through the thermal diffusion using $POCl_3$, the first and second poly-Si films are doped with phosphorus. Further, a tungsten film is formed and heat-treated so that the surface of the second poly-Si film 6 is reacted with the tungsten film, thereby forming a tungsten silicide film 7 having a thickness of 1000 A–2000 A.

Figure 1E:
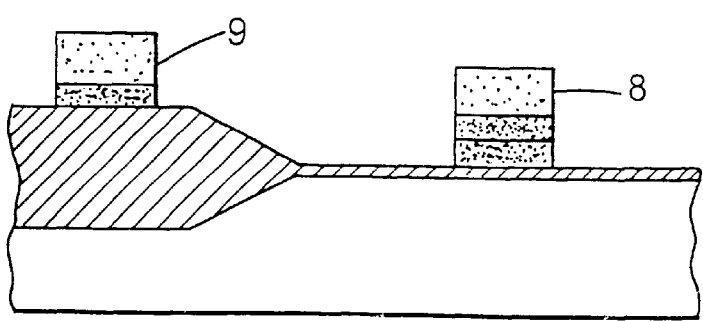

STEP 5:

As shown in FIG. 1E, using the photolithography, the first poly-Si film 3, the second poly-Si film 6 and tungsten silicide film 7 are patterned to form a gate electrode 8 and a wiring 9. Thereafter, the source and drain regions are formed through ion implantation technique using the gate electrode 8 as ion implantation mask. Thereby channel region is formed between the source and drain regions. And then an interlayer insulating film covering the gate electrode 8 is formed. Further, metal wirings are made on the interlayer insulating film to complete a semiconductor integrated circuit having various element regions.

In accordance with this embodiment, without removing the oxide film and first poly-Si film 3 which are used as a buffer film when forming the element isolation film 5, they are used, as they are, as the gate insulating film 2 and a part of the gate electrode 8. This reduces the number of steps in the manufacturing process. The gate electrode 8 formed on the gate insulating film 2 has a stacking structure composed of the first poly-Si film 3, second poly-Si film 6 and tungsten silicide film 7. The wiring 9 formed on the element isolation film 5 has a stacking structure composed of the second poly-Si film 6 and tungsten silicide film 7. Therefore, the gate electrode 8 is higher than the wiring 9 by the thickness of 500 A–1000 A of the first poly-Si film 3. Thus, the level difference between the upper surface and that of the wiring 9 can be relaxed by the thickness of the first poly-Si film 3.

As the thickness of the first poly-Si film increases, the thickness of the element isolation film 5 also increases so that the difference in thickness between the gate electrode 8 and wiring 9 increases. If the wiring is formed without using the first poly-Si film 3, the level difference can be greatly relaxed. For example, in the above example, the level difference between the surface of the semiconductor substrate 1 and that of the element isolation film is about 200 A. If the first poly-Si film 3 is formed to have a thickness of 1000 A, as compared with the prior art in which the level difference is 2000 A, in the present invention, the thickness of the wiring on the element isolation film is reduced by the thickness of the first poly-Si film 3 of 1000 A. This provides a level difference of about 1000 A between the gate electrode 8 and the wiring 9.

Embodiment 2

An explanation will be given of the second embodiment of the present invention.

Figure 2A:
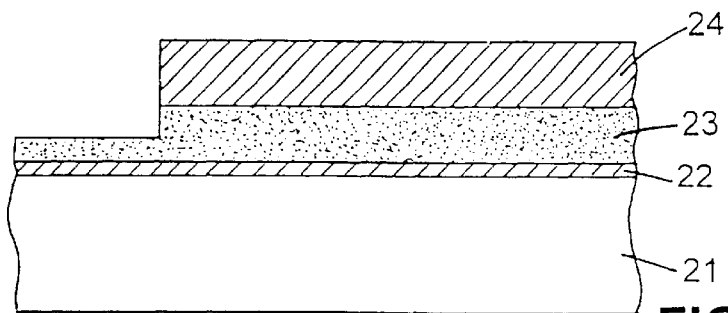
FIG. 2 is a sectional view for explaining a manufacturing method according to a second embodiment of the present invention.

STEP 1:

As seen from FIG. 2A, using the thermal oxidation technique, a gate insulating film 22 having a thickness of 50 A–200 A is formed on the surface of a semiconductor substrate 21. Using the CVD technique, a first poly-Si film 23 having a thickness of 500 A–2000 A is formed on the entire surface. Further, using the CVD technique, a silicon nitride film 24 having a thickness of 500–1000 A is formed which serves as an oxidation resisting film. Using a mask (not shown), an opening is formed in a prescribed region where an element isolation film is to be formed. Further, using the above mask or silicon nitride film 24 as a mask, the first poly-Si film 23 is etched so that it is left by a thickness of e.g. 500 A. In this case, the silicon nitride film 24 and first poly-Si film may be etched by different gases. However, by using $CF_4+CHF_3$ as an etching gas, in the process of etching the silicon nitride film 24, poly-Si can be etched. Therefore, these films can be successively etched.

Figure 2B:
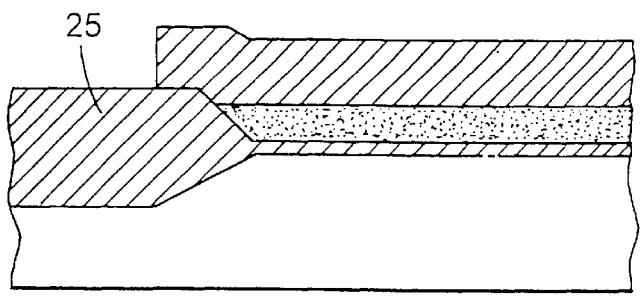

STEP 2:

As seen from FIG. 2B, the semiconductor substrate 21 is thermally oxidized using the silicon nitride film 23 as a mask to form an element isolation film 25. The swelling of the element isolation film 25 is absorbed by the thickness of the first poly-Si film 23 and the level difference generated by the above etching so that the level difference between the element isolation film 25 and the first poly-Si film 23 is reduced. By optimizing the thickness of the first poly-Si film 23 and condition of forming the element isolation film 25, the level difference can be removed completely. However, if the thickness of the first poly-Si film 23 is increased, oxidation on the side of the first poly-Si film 23 cannot be neglected. Therefore, attention must be paid to the shape at the end of the element isolation film 25.

Figure 2C:
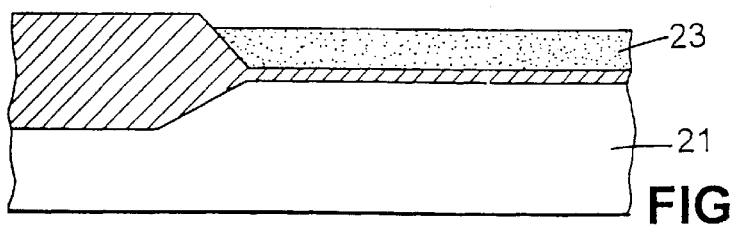

STEP 3:

As seen from FIG. 2C, the silicon nitride film 24 is removed.

Figure 2D:
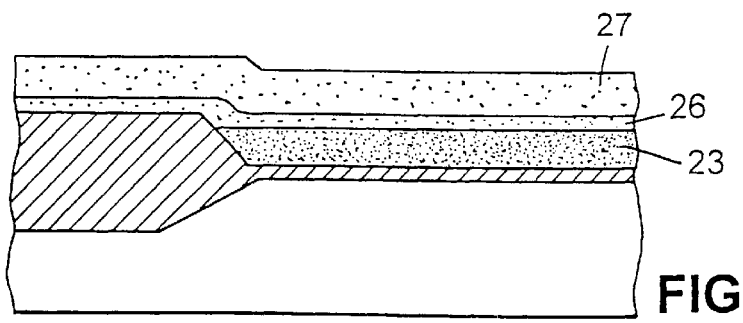

STEP 4:

As seen from FIG. 2D, using the CVD technique, a second poly-Si film 26 having a thickness of 100 A–1000 A is formed. Through the thermal diffusion using $POCl_3$, the first and second poly-Si films are doped with phosphorus. Further, a tungsten film 27 having a thickness of 1000 A–2000 A is formed.

Figure 2E:
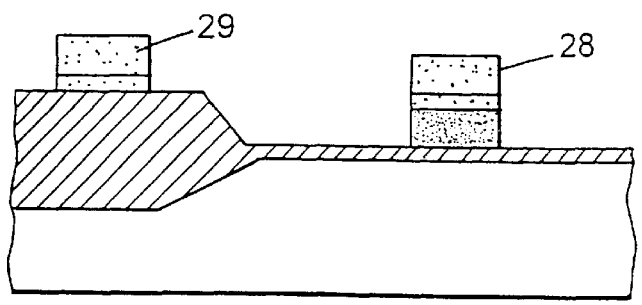
Figure 3A:
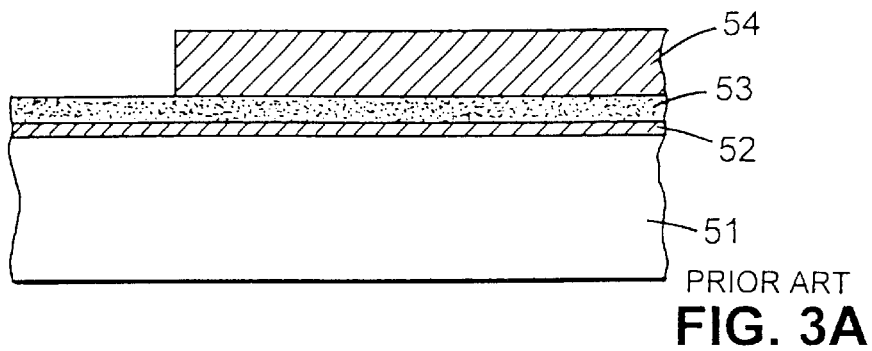
FIG. 3 is a sectional view for explaining a conventional manufacturing method.
Figure 3B:
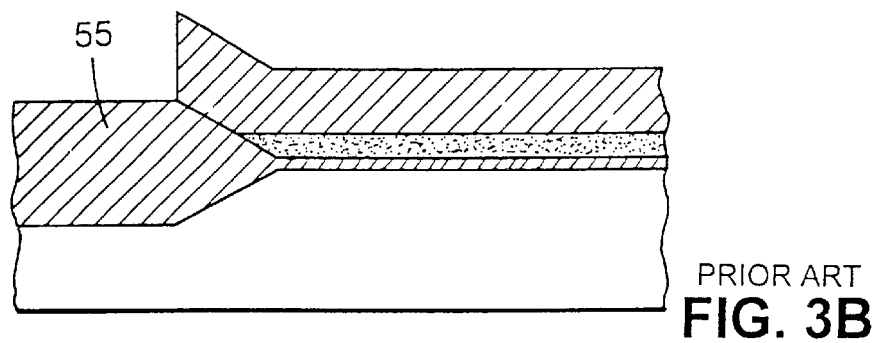
Figure 3C:
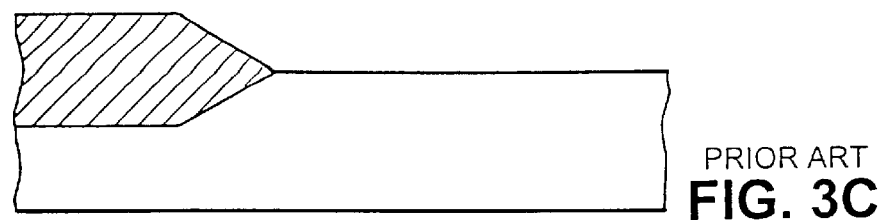
Figure 3D:
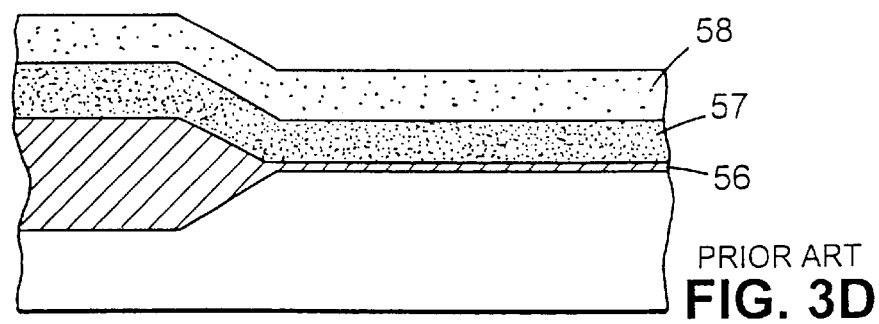
Figure 3E:
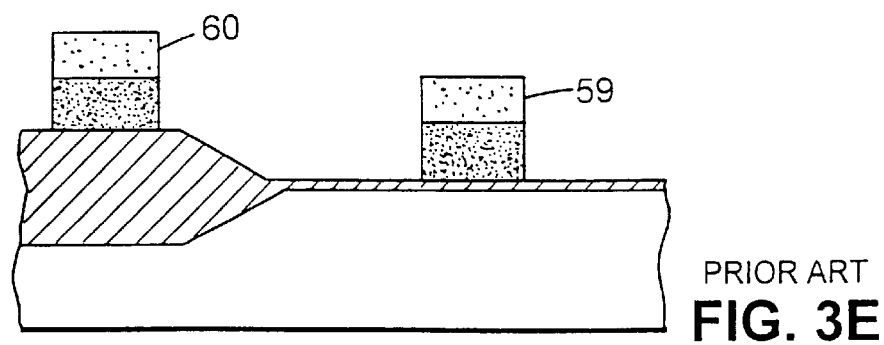

STEP 5:

As shown in FIG. 2E, using the photolithography, the poly-Si film 26 and tungsten silicide film 27 are patterned in any optional shape to form a gate electrode 28 and a wiring 29. Thereafter, like the first embodiment, the source and drain regions are formed, and an interlayer insulating film is formed. Further, wirings are made to complete a semiconductor integrated circuit having various element regions.

As described above, in accordance with this embodiment, even if the level difference between the semiconductor substrate 21 and element isolation film 25 is 2000 A, the level difference between the gate electrode 28 and the wiring 29 can be further relaxed by 500 A as compared with the first embodiment and the thickness of the element isolation film 25 can be made 3500 A like the first embodiment. This can be implemented in such a way that the first poly-Si film 23 having a thickness of 1500 A is formed; and using the silicon nitride film 24 as a mask, prior to the thermal oxidation in the LOCOS step, the first poly-Si film 23 is etched by 500 A to provide the first poly-Si layer having a thickness of about 1000 A on the region constituting the element isolation region. It is needless to say that the level difference can be substantially removed if the thickness of the first poly-Si layer 23 is set at 2000 A.

The second poly-Si film 6, 26 serves as a contact layer between the element isolation film 5, 25, which is made of $SiO_2$, and the tungsten film 7, 27. Therefore, unless the second poly-Si film is formed, the tungsten layer cannot be formed on the $SiO_2$ film. In order to make poly-Si conductive, the poly-Si is doped with e.g. phosphorus using $POCl_3$. In this case, unless the second poly-Si film is formed, the element isolation film 5, 25 is also doped with phosphorus so that the surface of the element isolation film is changed into PSG. This may lead to inconvenience such as a change in the etching rate. The second poly-Si film serves as a barrier against doping of phosphorus so that the element isolation film is not changed into PSG. Thus, the second poly-Si film must have a thickness of at least 100 A.

The tungsten silicide film is formed to reduce the resistance of the electrode and wiring so that without forming the tungsten film, the poly-Si may be used as the electrode and wiring as it is. Further, in place of tungsten, titanium or cobalt may be formed and heat-treated to form titanium silicide or cobalt silicide.

The poly-Si film may be replaced by amorphous silicon or other silicon film. The insulating film may be not only an $SiO_2$ film, but also a BPSG film or SOG film.

In the embodiments, the present invention was applied to the semiconductor device having "gate electrode" and "wiring". However, the present invention can be applied to various semiconductor devices such as a logic microcomputer and storage device (DRAM, flash-memory, etc.) as long as they are semiconductor devices which are element-isolated by the LOCOS technique.

What is claimed is:

1. A semiconductor device comprising:

a semiconductor substrate;

an element isolation film formed on a surface of said semiconductor substrates;

an element region surrounded by said element isolation film;

source/drain regions formed within the element region on the surface of the semiconductor substrate, and a gate insulating film and a gate electrode formed on a channel region between the source/drain regions; and a wiring formed on said element isolation film, wherein said gate electrode comprises a first silicon film and a second silicon film formed on said first silicon film and said wiring consisting of a two layer structure.

2. A semiconductor device according to claim 1, wherein a surface of said second silicon film is covered with a metal silicide film.

3. A semiconductor device according to claim 2, wherein said first silicon film is a poly-Si film which is more highly doped than said second silicon film.

4. A semiconductor device according to claim 2, wherein said first silicon film is a layer formed in a step of forming a poly-Si film to be thermally oxidized so as to form an element isolation film.

5. A semiconductor device according to claim 1, wherein the element isolation film is formed on the surface of said semiconductor substrate by Local Oxidation of Silicon technique.

6. A semiconductor device according to claim 1, wherein said first and second silicon films are made of poly-Si.

7. A semiconductor device according to claim 1, wherein the two layer structure is consisting of said second silicon film and a metal silicide film covering a surface of said second silicon film.

8. A semiconductor device comprising:

a semiconductor substrate;

an element isolation film formed on a surface of said semiconductor substrate;

an element region surrounded by said element isolation film;

source/drain regions formed within the element region on the surface of the semiconductor substrate, and a gate insulating film and a gate electrode formed on a channel region between the source/drain regions; and a wiring formed on said element isolation film, wherein said gate electrode comprises a first silicon film and a second silicon film formed on said first silicon film and said wiring consisting of said second silicon film, and a surface of said second silicon film is covered with a metal silicide film.

9. A semiconductor device according to claim 8, wherein the element isolation film is formed on the surface of said semiconductor substrate by Local Oxidation of Silicon technique.

10. A semiconductor device comprising:

a semiconductor substrate;

an element isolation film formed by the Local Oxidation of Silicon technique on a surface of said semiconductor substrate;

an element region surrounded by said element isolation film;

source/drain regions formed within the element region on the surface of the semiconductor substrate, and a gate insulating film and a gate electrode formed on a channel region between the source/drain regions; and a wiring formed on said element isolation film, wherein said gate electrode comprises a first silicon film and a second silicon film formed on said first silicon film and said wiring consisting of said second silicon film, and a surface of said second silicon film is covered with a metal silicide film.

11. A semiconductor device according to claim 10, wherein said first and second silicon films are made of poly-Si.

12. A semiconductor device according to claim 10, wherein said first silicon film is a poly-Si film which is more highly doped than said second silicon film.

13. A semiconductor device according to claim 10, wherein said first silicon film is a layer formed in a step of forming a poly-Si film to be thermally oxidized so as to form an element isolation film.

* * * * *